United States Patent
Kimura et al.

[11] Patent Number: 5,825,086
[45] Date of Patent: Oct. 20, 1998

[54] CERAMIC LID ASSEMBLY FOR SEMICONDUCTOR PACKAGES

[75] Inventors: Kazuo Kimura; Haruhiko Murata; Yukihiro Aoyama, all of Nagoya, Japan

[73] Assignee: NGK Spark Plug Co., Ltd., Nagoya, Japan

[21] Appl. No.: 690,460

[22] Filed: Jul. 29, 1996

Related U.S. Application Data

[63] Continuation of Ser. No. 272,577, Jul. 11, 1994, abandoned.

[30] Foreign Application Priority Data

Aug. 27, 1993 [JP] Japan .................................. 5-235389

[51] Int. Cl.[6] .................................................. H01L 23/02
[52] U.S. Cl. ......................... 257/704; 428/614; 428/620; 428/632; 428/669; 174/52.4
[58] Field of Search ..................... 428/609, 612, 428/614, 620, 632, 646, 672, 669, 680; 220/200; 174/52.4; 257/704

[56] References Cited

U.S. PATENT DOCUMENTS

| | | | |
|---|---|---|---|
| 3,590,468 | 7/1971 | Buck et al. | 228/203 |
| 4,076,955 | 2/1978 | Gates, Jr. | 174/52.4 |
| 4,291,815 | 9/1981 | Gordon et al. | 220/200 |
| 4,331,253 | 5/1982 | Gordon et al. | 220/200 |
| 4,356,047 | 10/1982 | Gordon et al. | 156/89 |
| 4,626,960 | 12/1986 | Hamano et al. | 174/52.4 |
| 4,746,583 | 5/1988 | Falanga | 428/632 |
| 4,748,085 | 5/1988 | Fukuda et al. | 428/432 |
| 4,851,301 | 7/1989 | Greenstein | 428/632 |
| 4,865,877 | 9/1989 | Yamaguchi et al. | 427/98 |
| 5,329,160 | 7/1994 | Miura et al. | 257/704 |

FOREIGN PATENT DOCUMENTS

| | | | |
|---|---|---|---|
| 54-98178 | 8/1979 | Japan | 257/704 |
| 60-173861 | 9/1985 | Japan | 257/704 |
| 2-250359 | 10/1990 | Japan | 257/704 |

OTHER PUBLICATIONS

W. Yang, "Preflow Solder Ceramic Lids for Hermatic Packages", Solid State Technology, Dec. 1984, pp. 137–143.

*Primary Examiner*—Ngoc-Yen Nguyen
*Attorney, Agent, or Firm*—Foley & Lardner

[57] ABSTRACT

A ceramic lid assembly includes an integral metallized layer provided around the periphery of a ceramic lid substrate to serve as a foundation for a solder layer. A portion of the metallized layer for contact with the ceramic lid substrate is formed from a metallized paste containing glass frits so that the metallized layer is baked to adhere to the ceramic lid by reflowed glass frits. A portion of the metallized layer for contact with the solder layer is formed from a metallized paste containing no glass frits so that substantially no void is formed in the solder layer.

1 Claim, 4 Drawing Sheets

CERAMIC LID ASSEMBLY FOR SEMICONDUCTOR PACKAGES

This application is a continuation, of application Ser. No. 08/272,577, filed Jul. 11, 1994, now abandoned.

BACKGROUND OF THE INVENTION

1. Field of the Invention

The present invention relates in general to hermetic sealing of semiconductor chips, and more particularly to a ceramic lid assembly having an integral heat fusible layer for hermetic sealing of a package containing a semiconductor chip.

2. Description of the Prior Art

A typical example of known lid assembly for use in the above described hermetic sealing is shown in FIG. 5. The lid assembly includes a metallized layer (thick film metallization) 56 around the periphery of a lid member or substrate 51 to define a hermetic sealing area 54 on the surface 53 which faces a package (indicated by 11 in FIGS. 6A–6C). The metallized layer 56 is formed from a Ag(silver)-Pd(palladium) paste which contains glass frits G and is screened on the lid substrate 51 and baked, to serve as an undercoat or foundation for a fusible layer H. The lid substrate 51 is dipped, in the subsequent process, into the bath of molten fusible solder and thereby formed with the fusible layer H only on the metallized layer 56, whereby to prepare for hermetic sealing attachment of the lid substrate 51 to the package.

In the prior art lid assembly, the metallized layer 56 has innumerable glass frits G at the surface thereof. Thus, when the fusible layer H is formed on the metallized layer 56, a number of voids V are caused in the fusible layer H as shown in FIG. 5. It is considered that such voids V are caused due to the fact that the solder cannot wet the glass frits G, so during the forming of the solder layer H the flux gas causes such voids V in the places where it contacts the glass frits G.

As shown in FIGS. 6A to 6C, the lid assembly encounters a problem during a process of hermetically sealing a package 11 with the lid substrate 51. That is, during the hermetic sealing of the package 11, the solder H is spread to the inside and outside of the package 11, causing a defect in hermetic sealing and appearance or a defect that solders spread to adhere to lead pins and a semiconductor chip develop short circuits, and thus reducing the yield. Further, if large voids remain in some places without causing the spreading of the solder, the hermeticity is deteriorated at those places. It is considered that such a problem is caused by the voids V existing in the solder layer H since the voids V are joined and thermally expanded to produce the large voids Va and cause the spreading of the solder H when the voids Va are broken to scatter the gas contained therein.

SUMMARY OF THE INVENTION

In accordance with the present invention, there is provided a ceramic lid substrate for hermetic sealing of a semiconductor package, which comprises a ceramic substrate having a peripheral region defining a hermetic sealing area, a first metallized layer containing a precious metal and glass frits and baked to adhere to the peripheral region of the ceramic substrate by means of the glass frits, and a second metallized layer containing no glass frit and formed on the first metallized layer to provide a surface on which a solder layer is to be formed.

This structure is effective for solving the above noted problem inherent in the prior art lid assembly.

It is accordingly an object of the present invention to provide a novel and improved ceramic lid assembly which makes it possible to attain a semiconductor package having a high hermeticity and quality assuredly.

It is a further object of the present invention to provide a novel and improved ceramic lid assembly of the above described character which can assuredly increase the yield rate and therefore reduce the cost.

It is a further object of the present invention to provide a novel and improved ceramic lid assembly of the above described character which can assuredly prevent spreading of solder resulting from voids present in a solder layer for thereby preventing short circuits and a defect in appearance otherwise caused.

DETAILED DESCRIPTION OF THE PREFERRED EMBODIMENTS

Figure 6A:
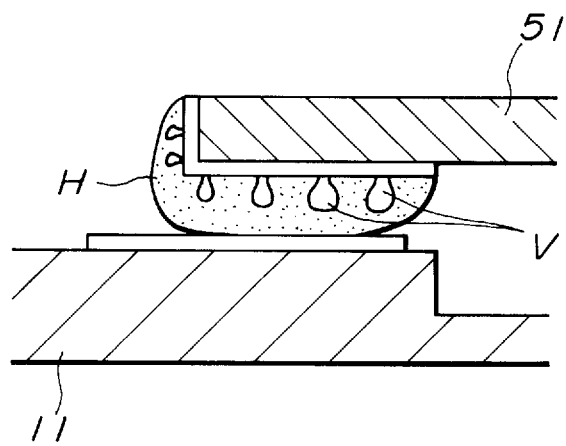
FIGS. 6A to 6C are reduce, fragmentary sectional views of the lid assembly of FIG. 5 and a semiconductor package for illustrating how spreading of solder is caused during hermetic sealing of the package.
Figure 6B:
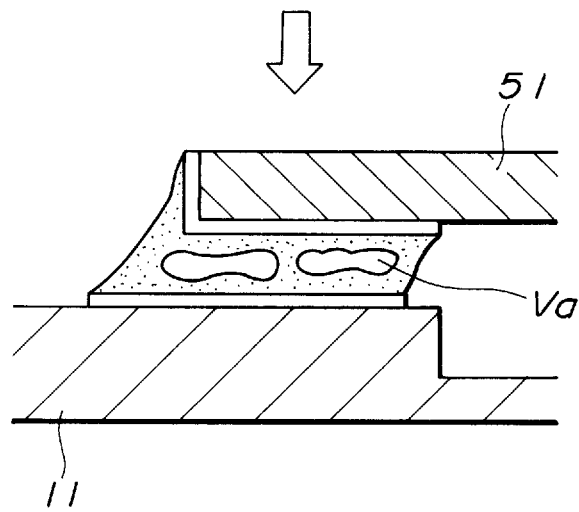
Figure 6C:
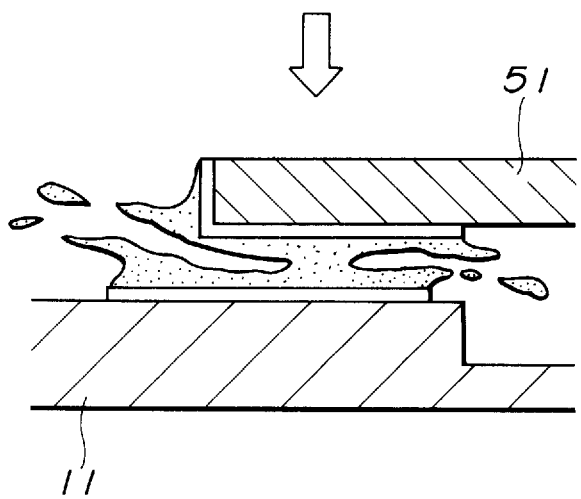

Referring to FIGS. 1 to 4, a ceramic lid assembly according to an embodiment of the present invention is generally indicated by 10 and includes a nearly square ceramic lid member or substrate 12 the length of the side of which is about 27 mm. The lid substrate 12 has a side surface 14 that faces a semiconductor package (refer to FIGS. 6A to 6C) and a circumferential surface 16 at the periphery of the side surface 14. The lid assembly 10 has, on a peripheral portion of the side surface 14 and the circumferential surface 16 of the lid substrate 12, a metallized layer 18. The width of the peripheral portion of the side surface 14 is 2 mm whilst the width of the circumferential surface 16, which corresponds to the thickness of the lid substrate 12, is 0.7 mm. The metallized layer 18 has a rectangular loop-like shape or a hollow, rectangular shape and is formed with a recess 20 at a central portion of the inner periphery of each side, so as to be partially reduced in width (refer to FIG. 2). The ceramic lid substrate 12 is made of such a ceramic material containing 90% alumina and formed by stamping and baking.

More specifically, the metallized layer 18 consists of a first metallized layer section 18a and a second metallized layer section 18b. The first metallized layer section 18a is of the thickness of 15 μm and formed from a Ag(silver)-Pd (palladium) paste containing 15 wt. % glass frit G by screen printing the paste on the periphery of the side surface 14 and the circumferential surface 16 of the lid substrate 12 and baking the printed paste.. The second metallized layer section 18b is of the thickness of 15 μm and formed from a Ag(silver)-Pd(palladium) paste containing no glass frit. The second metallized layer section 18b is formed on the first metallized layer section 18a by screen printing and baking of the paste similarly to that of the first metallized layer section 18a so as to constitute the metallized layer 18 of the total thickness of 30 μm as a foundation for forming thereon a solder layer H. In this connection, it is to be noted that the first metallized layer section 18a is formed from a paste of a precious metal, i.e., a Ag(silver)-Pd(palladium) alloy, and containing glass frits G so that the glass frits G are diffused and immersed in the ceramic material of the lid substrate 12 to enable the first metallized layer section 18a to be closely adhered or bonded to the lid substrate 12. The second metallized layer section 18b covers the first metallized layer section 18a so as to prevent the glass frits G from being exposed to the outside and serve as an undercoat or foundation for the solder layer H to be formed thereon.

In case of forming the solder layer H, the ceramic lid substrate 12 is immersed in a flux and then in a molten solder and thereafter pulled out therefrom to be cooled to solidify the solder so that the solder layer H of a predetermined thickness is formed on the second metallized layer section 18b at the periphery of the side surface 14 and the circumferential surface 16 of the lid substrate 12. In this instance, at the surface of the metallized layer 18, i.e., at the surface of the second metallized layer section 18b, there does not exist or there is not exposed any frit G so the solder can fully wet the metallized layer 18.

Figure 1:
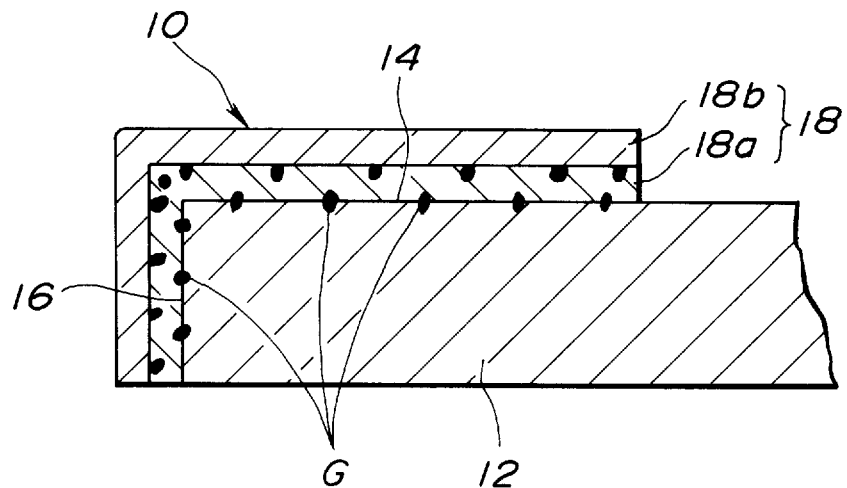
FIG. 1 is a sectional view of an important portion of a ceramic lid assembly for a semiconductor package according to an embodiment of the present invention.
Figure 2:
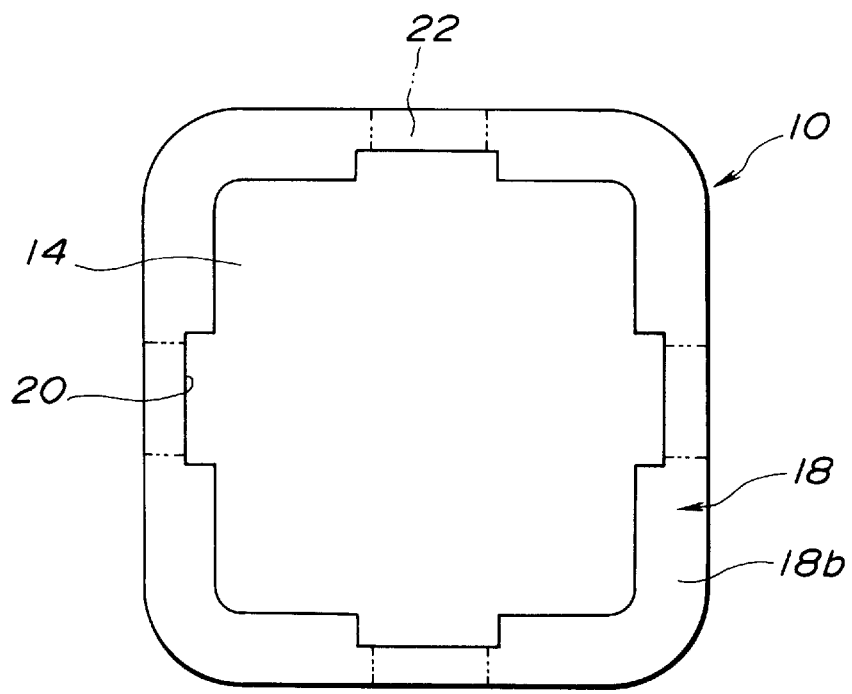
FIG. 2 is a reduced, plan view of the lid assembly of FIG. 1 for illustration of a peripheral region of a lid defining a hermetic sealing area.
Figure 3:
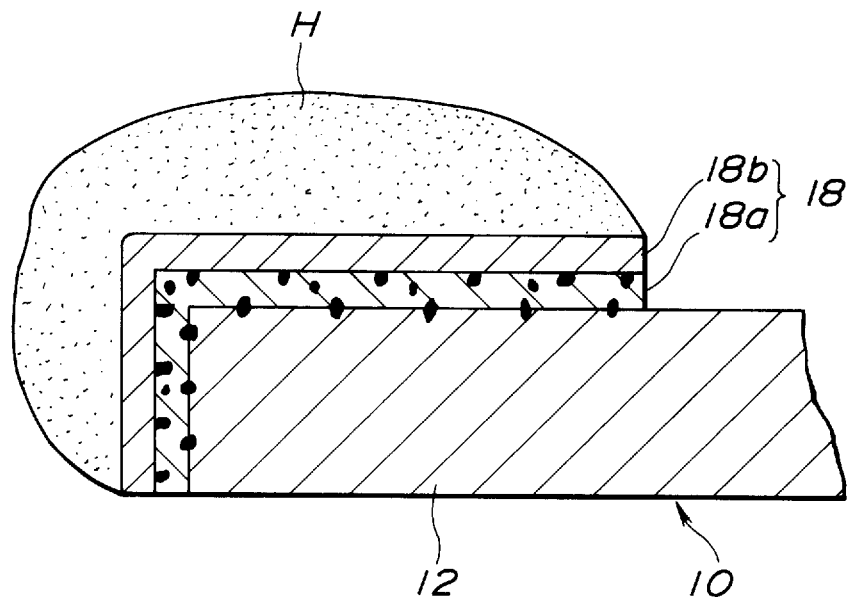
FIG. 3 is a sectional view similar to FIG. 1 but shows the lid assembly further provided with a solder layer.

In this manner, as shown in FIG. 3, the solder layer H having no void, which is otherwise caused in the presence of the glass frit, could be obtained. The solder used in this embodiment has a composition consisting of 85 wt. % Pd(Palladium), 5 wt. % Sn(tin), 7 wt. % Bi(bismuth) and the remainder of Ag(silver) and In(indium), and has a solidus line temperature of 240° C. and a liquidus line temperature of 280° C. In the meantime, in this embodiment, the metallized layer 18 is reduced in width at the central portion of each side, so the solder becomes thicker at the wider portion of the metallized layer 18 as compared with the narrower portion by the effect of the surface tension whilst becoming thinner at the narrower portion so as to form a groove (gas path) 22, whereby the lid assembly 10 is capable of preventing the pressure within the package from becoming excessively high during a hermetic sealing process of the package.

In order to recognize a concrete effect of the lid assembly 10 of this invention, a comparative example (prior art lid assembly) is prepared which has a metallized layer formed in the similar manner described as above from a Ag(silver)-Pd(palladium) paste containing 15 wt. % glass frit and having the thickness of 15 μm and a solder layer formed in the similar manner described as above on the metallized layer. The lid assembly 10 of this invention was compared with the comparative example with respect to the number of voids in the solder layer by using a metallurgical microscope. In the meantime, ten samples for this invention and ten samples for comparison were prepared. The result is shown in Table I (in left-hand part of the Table).

As shown in Table I, the number of voids per square centimeters in any sample of this invention was in the range from 0 to 6, whereas the number of voids per square centimeters in any comparative sample was in the range from 10,000 to 25,000.

TABLE I

| Metallized Layer Structure | Number of Voids in Solder Layer | Spreading-of-Solder Occurrence Rate |
| --- | --- | --- |
| Two-Layer Structure made up of Ag-Pd Layer containing Glass Frits and Ag-Pd Layer containing no Glass Frit | 0~6 /cm$^2$ | 0% |
| Single Layer Structure made up of Ag-Pd Layer containing Glass Frits | 10,000~25,000 /cm$^2$ | 10% |

Further, with the lid assemblies of the above two kinds (100 lid assemblies were prepared for each kind), the packages were hermetically sealed so as to compare each kinds of packages with respect to the rate at which spreading of solder occurred during the hermetic sealing process. The result is shown in Table I (in right-hand part of the Table). As will be seen from Table I, the spreading-of-solder occurrence rate was 0% in case of the packages using the lid assemblies of this invention but was 10% (10 samples) in case of the packages using the comparative sample lid assemblies. From this, it will be understood that the present invention is effective for overcoming the disadvantages resulting from the existence of voids. It will be further understood that such a small number of voids existing in the lid assembly of this invention does not cause any spreading of solder.

In the foregoing, it is to be noted that the hollow, rectangular metallized layer 18 is formed so as to have a smaller width at the central portion of each side. By this, the grooves 22 extending across each sides are automatically formed during the solder layer forming process. Such grooves 22 are effective for preventing the pressure within the package from becoming excessively high during the hermetic sealing process of the package.

It is further to be noted that while the lid assembly 10 provided with the metallized layer 18 on the periphery of the side surface 14 and the circumferential surface 16 of the lid substrate 12 has been described and shown, it will do to form the metallized layer 18 only on the periphery of the side surface 14. However, in case of forming the metallized layer 18 on both the periphery of the side surface 14 and the circumferential surface 16 of the lid substrate 12, it is desirable to form a chamfer at the corner or edge at which the surfaces 14 and 16 meet. If such a chamfer is not provided, the metallized layer 18 will not be formed desiredly at that corner, causing a problem that the ceramic substrate 12 is partially exposed to cause a mechanical defect. Such a problem may be solved by the provision of the chamfer. For example, in case of the chamfer being of the rounded type, the radius of the rounding is within the range from about 25 μm to 150 μm. In case of the chamfer being of a beveled type of the slant angle of 45°, the width of the beveled surface is within the range from about 25 μm to 150 μm.

It is further to be noted that while the metallized layer 18 has been described and shown as being made up of two layer sections including the second layer section 18b formed from a metallized paste containing no glass frit so that the second layer 18b can serve as a foundation for the solder layer, it will do that there does not exist any glass frit at the surface of the metallized layer 18 irrespective of the number of metallized layer sections, whereby there is not caused any void in the solder layer H. For example, the metallized layer 18 can be made up from more than three metallized layer sections, so that the outermost layer section constitutes a thick film metallization containing no glass frit.

Figure 4:
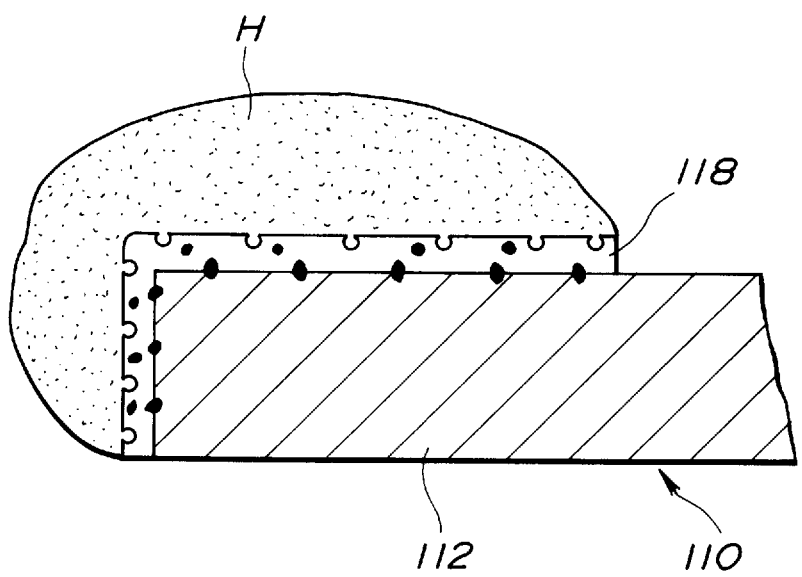
FIG. 4 is a sectional view similar to FIG. 3 but shows a further embodiment.
Figure 5:
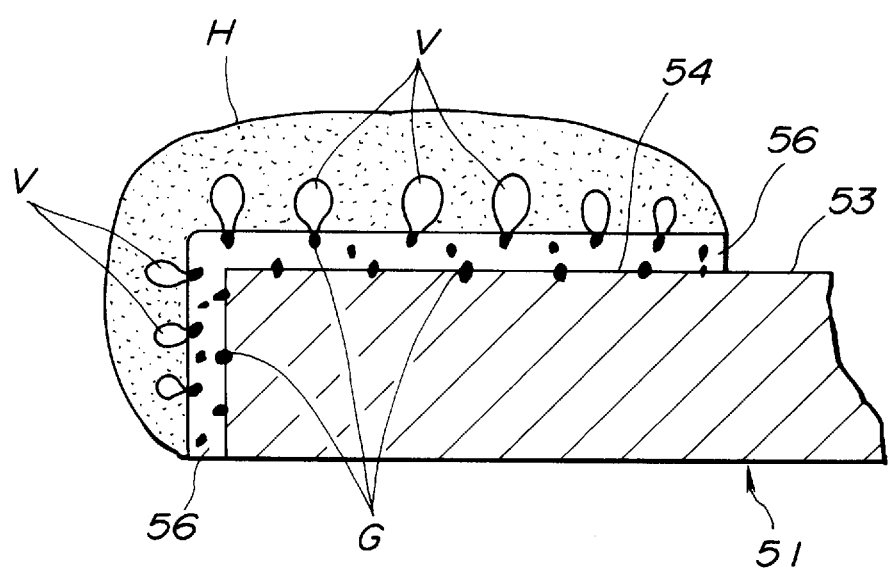
FIG. 5 is an enlarged, fragmentary sectional view of a prior art ceramic lid assembly.

FIG. 4 shows a lid assembly 110 according to a further embodiment. In this embodiment, the ceramic lid assembly 110 is formed with a metallized layer 118 by screen printing a paste, as for example a Ag(silver)-Pd(palladium) paste containing glass frits on a ceramic lid or ceramic lid substrate 112 and baking the printed paste. Thereafter, the surface of the metallized layer 118 is cleaned by, for example, being immersed in a hydrofluoric acid solution having a suitable density (in the range from 3% to 5%) for a predetermined time (e.g., several tens of seconds) so that only the glass frits exposed to the surface are selectively dissolved (etched) and removed so that no glass frit exists at the surface on which the solder layer is to be formed. Thereafter, the solder layer H is formed in the similar manner to the previous embodiment, whereby it becomes possible to obtain the lid substrate 112 in which no glass frits exist at the interface between the metallized layer 118 and the solder layer H. This embodiment is advantageous since by the use of such a dissolving device or facility the lid assembly 110 can be obtained with only one baking process for baking the metallized layer 118.

In the previous embodiment in which a metallized layer is made up of a plurality of layer sections, a suitable thickness of one layer section is in the range from 5 $\mu$m to 25 $\mu$m. When the thickness is smaller than 5 $\mu$m, it is too thin so that an insufficiency in the amount of glass frits to be diffused into the ceramic material is caused, resulting in the reduced adhesion or bonding strength. Further, when the thickness becomes larger beyond 25 $\mu$m, it is too thick so that a large amount of glass frits remains at the surface of the thick layer section without being diffused into the ceramic material during baking, thus causing a large amount of glass frits to be diffused into the layer section, which is formed on the thick layer section as a foundation for a solder layer, and be exposed to the surface thereof.

While a metallized layer, which contains a precious metal and to be baked on a ceramic lid substrate by means of glass frits, has been described as being formed by printing and baking of a Ag(silver)-Pd(palladium) paste (i.e., a thick film metallization), it is not for the purpose of limitation. For example, a paste containing a precious metal such as gold (Au), silver (Ag), platinum (Pt), palladium (Pd) or rhodium (Rh), or an alloy paste such as silver-platinum paste may be printed and baked for the same end. Further, a paste of precious metals or precious metal alloy containing a base metal may be printed and baked for the same end.

Further, while the first and second layer sections of the metallized layer have been described and shown as being formed from the same material, this is not for the purpose of limitation but the layer sections can be formed from different materials.

Further, the metallized layer providing the surface to serve as a foundation for the solder layer, can be of the other kind so long as the solder layer is wettable thereon. Accordingly, although the cost becomes higher, a metallized paste similar to the described above one is formed in the hermetic sealing area of the ceramic lid substrate by printing and baking as a first layer section, then a Ni plating is applied on the first layer section, and thereafter gold (Au) or tin (Sn) may be plated on the surface of the Ni plating. However, in case of the gold(Au) plating being applied, there is no necessity of applying a Ni plating prior to the gold (Au) plating.

The solder layer to be formed on the lid of this invention can be of the Pb—Sn type, the Pb—Sn—Ag type, Pb—In—Ag type or the like according to the necessity. Further, the method of forming the solder layer can be of the kind of placing a preformed solder on the lid substrate and allowing the same to reflow. Further, aluminum nitride, mullite, zirconia or the like other than alumina can be used as a ceramic for forming the lid substrate of this invention.

From the foregoing, it will be understood that in a ceramic lid assembly of this invention there does not exist substantially any glass frit at the surface of a metallized layer when a lid substrate formed with the metallized layer is dipped in a molten metal to form a solder layer on the metallized layer, thus making it possible to prevent voids from being formed in the solder layer effectively.

It will be further understood that in the ceramic lid assembly of this invention there does not exist, in any event, any glass frit at the interface between a metallized layer and a solder layer, resulting in considerable reduction in the number of voids in the solder layer, and therefore making it possible to effectively prevent the spreading of the solder caused by the voids in the solder layer and the short circuits and the defective appearance caused by such spreading of the solder. As a result, it becomes possible to increase the yield rate of the semiconductor package and reduce the cost. Further, there does not remain any large void in the solder layer after the hermetic sealing process, thus making it possible to obtain a semiconductor package having a good hermeticity and a high quality.

Further, it will be understood that according to the present invention it becomes possible to utilize a ceramic lid for large-sized packages, which have heretofore been considered as being unsuitable for being sealed by using a ceramic lid, thus making it possible to reduce the cost considerably.

What is claimed is:

1. A hermetic sealed semiconductor package assembly comprising a lid, wherein said lid comprising:

a ceramic substrate having a peripheral region defining a hermetic sealing area;

a first metallized layer which is a sintered thick-film layer made of a precious metal or precious metal alloy, said layer containing glass frits and formed on said peripheral region of said ceramic substrate;

a second metallized layer which is a sintered thick-film layer made of the same precious metal or precious metal alloy of said first metallized layer but having no glass frit and formed on said first metallized layer; and a solder layer formed on said second metallized layer; said solder layer having from 0 to 6 voids per square centimeter alone the interface between said solder layer and said second metallized layer, said lid being bonded to a semiconductor package to form the assembly, wherein said first metallized layer has a thickness in the range from 5 $\mu$m to 25 $\mu$m.

* * * * *